(12) United States Patent
Gratz et al.

(10) Patent No.: US 7,485,542 B2
(45) Date of Patent: Feb. 3, 2009

(54) METHOD FOR PRODUCING BIT LINES FOR UCP FLASH MEMORIES

(75) Inventors: Achim Gratz, Dresden (DE); Mayk Roehrich, Dresden (DE); Veronika Polei, Dresden (DE)

(73) Assignee: Infineon Technologies AG, Munich (DE)

( * ) Notice: Subject to any disclaimer, the term of this patent is extended or adjusted under 35 U.S.C. 154(b) by 364 days.

(21) Appl. No.: 11/194,059

(22) Filed: Jul. 29, 2005

(65) Prior Publication Data

US 2006/0024889 A1    Feb. 2, 2006

Related U.S. Application Data

(63) Continuation of application No. PCT/DE2004/000042, filed on Jan. 15, 2004.

(30) Foreign Application Priority Data

Jan. 30, 2003    (DE)    ................... 103 03 847

(51) Int. Cl.
    *H01L 21/76*    (2006.01)
(52) U.S. Cl. .................. 438/424; 438/257; 438/296; 438/593; 438/211; 438/201
(58) Field of Classification Search .............. 438/257, 438/296, 593, 211, 201
    See application file for complete search history.

(56) References Cited

U.S. PATENT DOCUMENTS

| | | | |
|---|---|---|---|
| 4,855,800 A | 8/1989 | Esquivel et al. | |
| 5,278,438 A | 1/1994 | Kim et al. | |
| 5,299,631 A | 4/1994 | Dauvergne | |
| 5,570,314 A | 10/1996 | Gill | |
| 5,661,057 A | 8/1997 | Fujiwara | |
| 6,001,687 A | 12/1999 | Chu et al. | |
| 6,214,741 B1 | 4/2001 | Lee | |
| 6,720,610 B2 * | 4/2004 | Iguchi et al. ................. | 257/315 |
| 2001/0018249 A1 | 8/2001 | Tanaka | |
| 2002/0038897 A1 * | 4/2002 | Tuan et al. ................... | 257/372 |
| 2002/0045304 A1 | 4/2002 | Lee | |
| 2002/0167082 A1 * | 11/2002 | Weber et al. ................. | 257/696 |
| 2003/0008457 A1 | 1/2003 | Makimoto | |
| 2004/0111159 A1 * | 6/2004 | Pope et al. ................ | 523/17.14 |

FOREIGN PATENT DOCUMENTS

WO    WO 01/17022 A1    3/2001

* cited by examiner

*Primary Examiner*—Fernando L Toledo
*Assistant Examiner*—Jae Lee
(74) *Attorney, Agent, or Firm*—Slater & Matsil, L.L.P.

(57) ABSTRACT

A semiconductor device can be fabricated by forming a floating gate layer over a semiconductor body. The floating gate layer is at least partially arranged over an insulation region in the semiconductor body. The floating gate layer is patterned to expose a portion of the insulation region. A recess is formed in a portion of the insulation region exposed by the patterned floating gate layer. A conductor is deposited within the recess. The conductor serves as a buried bitline. An insulator can then be formed within the recess over the conductor.

20 Claims, 4 Drawing Sheets

METHOD FOR PRODUCING BIT LINES FOR UCP FLASH MEMORIES

This application is a continuation of co-pending International Application No. PCT/DE2004/000042, filed Jan. 15, 2004, which designated the United States and was not published in English, and which is based on German Application No. 103 03 847.7 filed Jan. 30, 2003, both of which applications are incorporated herein by reference.

TECHNICAL FIELD

The invention relates to a method for producing bit lines for UCP flash memories having a floating gate arrangement arranged on a substrate and an insulation under the floating gate arrangement, the floating gate initially being produced after preceding photolithography by etching of a poly-Si layer deposited over the whole area and situated on the substrate.

BACKGROUND

In the case of UCP (Uniform Channel Program) flash memories, two bit lines are necessary for the connection of source and drain of the memory transistors. As a result, the pitch dimension in the cell array in the direction perpendicular to the bit lines cannot become smaller than twice the minimum pitch between the metal interconnects. Routing the bit lines in different wiring planes also does not change anything about this, in principle, since the distance between the interconnects and the contact holes (vias) for connecting different wiring planes quite generally has essentially the same magnitude as the distance between two interconnects.

In the direction parallel to the bit lines, the pitch dimension is generally already configured in minimal fashion corresponding to the state of the art. The present-day concepts for UCP memories, therefore, use particularly aggressive metal design rules in order to enable cell sizes that are as small as possible. A competitive disadvantage nevertheless remains in comparison with other concepts, particularly in the case of large and very large memories.

A substantial reduction of the cell size can only be achieved if it is possible to bury one of the two bit lines, i.e., to route it essentially beneath the substrate surface. Such a buried bit line has to satisfy further requirements with regard to its resistance and capacitance per unit length and must not substantially increase the production costs. Moreover, the conductive material used for the buried bit line has to withstand the temperature budget of the subsequent processes without any damage.

SUMMARY OF THE INVENTION

Therefore, the invention is based on the object of providing a method for producing bit lines for UCP flash memories by means of which a reduction of the cell size is achieved, the production costs are influenced insignificantly and the bit line withstands the temperature budget of the subsequent processes without any damage.

In the case of a method of the type mentioned in the introduction, the formulated object on which the invention is based is achieved by virtue of the fact that the bit line is arranged as a buried bit line made of a temperature-resistant material in a silicon substrate or within the insulation of the active areas under the floating gate in a self-aligned manner with respect thereto.

In a continuation of the invention, using the already patterned floating gate as an etching mask, a trench is etched into the insulation and is subsequently filled with a low-impedance material.

The solution according to the invention has the advantage that no additional photolithographic steps have to be performed, as a result of which the additional process costs for producing the buried bit line are minimized. Moreover, as a result of the self-alignment of the buried bit line with respect to the floating gate, there is no need for any further tolerance buffers for ensuring the minimum distances and extraordinarily stable conditions result with regard to parasitic capacitive couplings, in particular with respect to the floating gate and the control gate of the memory cell. These can additionally be adapted within a wide scope to technical process and circuitry requirements by means of a corresponding configuration of the lateral and upper termination of the buried bit line.

By way of example, a metal having a high melting point, preferably tungsten, is used for filling the trench with a low-impedance material.

The trench may be filled with tungsten, tungsten silicide or a highly doped polysilicon in a simple manner by means of a CVD deposition.

One refinement of the invention is characterized in that the etching of the trench is stopped shortly above the bottom of the insulation, so that the buried bit line remains completely insulated within the insulation.

In a further advantageous refinement of the invention, the trench is etched through the insulation, as a result of which a well contact is formed outside the insulation by means of the buried bit line.

Finally, one or more so-called insulating or conductive liners are deposited as lateral and/or lower termination of the buried bit line in the trench prior to the deposition of the bit line.

The lateral and/or lower termination of the buried bit line may in this case comprise an insulating material, preferably silicon dioxide, silicon nitride, or titanium or titanium nitride.

The buried bit line is situated in self-aligning fashion with respect to the floating gate in the cell arrangement, as a result of which there is no need for an additional mask layer for forming it.

BRIEF DESCRIPTION OF THE DRAWINGS

The invention will be explained in more detail below using an exemplary embodiment. In the associated drawings.

Figure 1A:
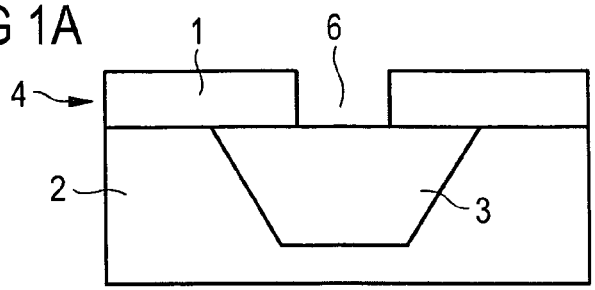
FIGS. 1a-e show a schematic process sequence for producing a buried self-aligning bit line in the insulation of the active areas.

The following list of reference symbols can be used in conjunction with the figures:

| | |
|---|---|
| 1 | Floating gate |
| 2 | Si substrate |
| 3 | Insulation |
| 4 | Polysilicon |
| 5 | Buried bit line |
| 6 | Trench |
| 7 | Tungsten |
| 8 | Liner |
| 9 | Oxide |
| 10 | Drain |
| 11 | Source region |
| 12 | Cell region |
| 13 | Bit line |
| 14 | Bit line |
| 15 | Via |

DETAILED DESCRIPTION OF ILLUSTRATIVE EMBODIMENTS

Three process variants are described in the exemplary embodiment. The starting point is in each case a floating gate arrangement 1 on an Si substrate 2 and an insulation 3 (shallow trench isolation) made of $SiO_2$ in the Si substrate 2 under the floating gate arrangement 1, the floating gate 1 initially being produced after preceding photolithography by etching into a polysilicon layer 4 situated on the silicon substrate.

In a first variant (FIG. 1b), the buried bit line 5 is situated within the insulation 3, or, in a second variant, extends through the insulation 3 into the region of the well situated underneath (FIG. 1c), so that a well contact may additionally be realized in the p-type substrate 2.

Figure 1B:
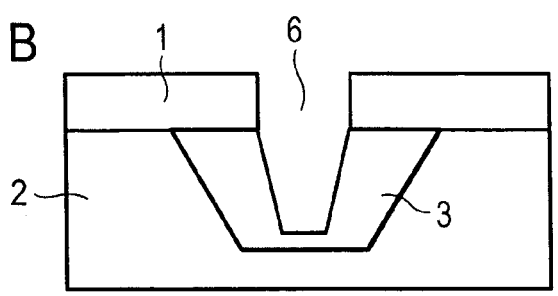
Figure 1C:
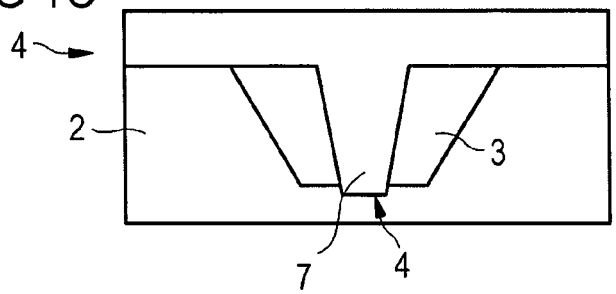
Figure 1D:
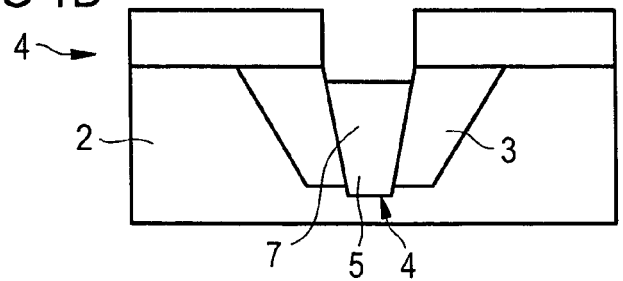
Figure 1E:
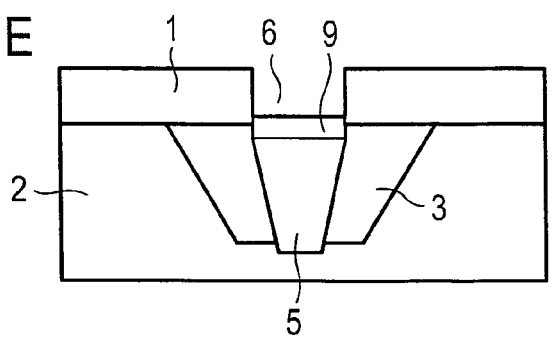
Figure 2A:
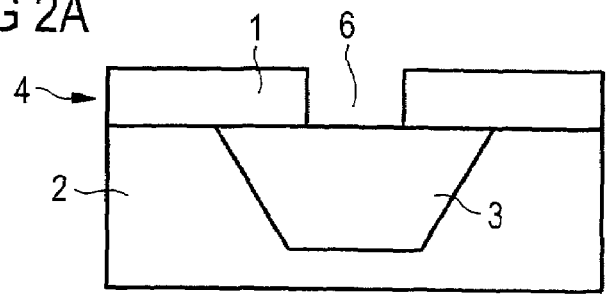
FIGS. 2a-e show a schematic process sequence according to FIG. 1 with an additional oxide liner surrounding the bit line in the etching trench.
Figure 2B:
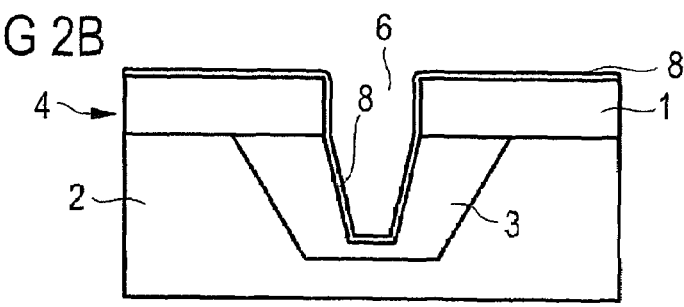
Figure 2C:
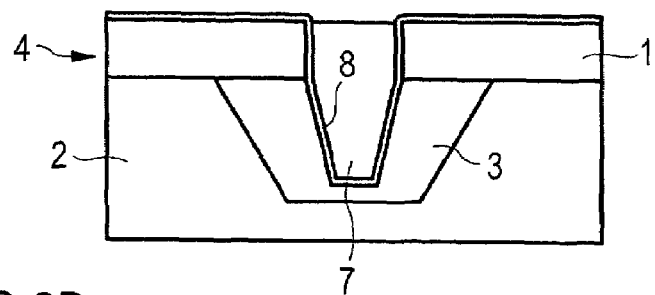
Figure 2D:
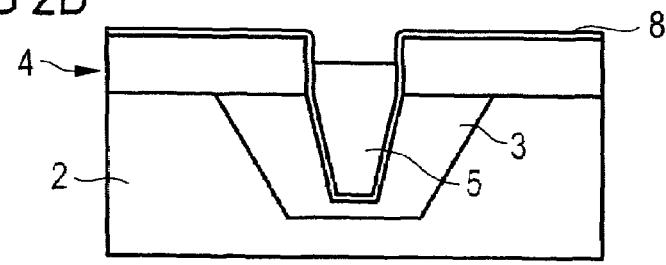
Figure 2E:
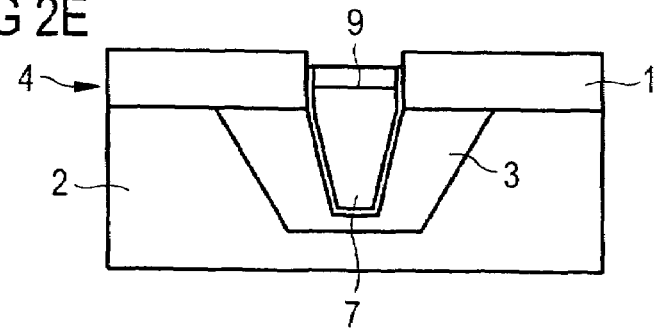
Figure 3A:
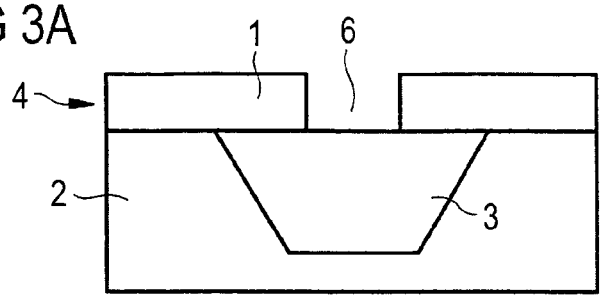
FIGS. 3a-e show a variant of the method according to FIG. 1 in which polysilicon is used for the buried bit line that is surrounded with an oxide liner as in FIG. 2.
Figure 3B:
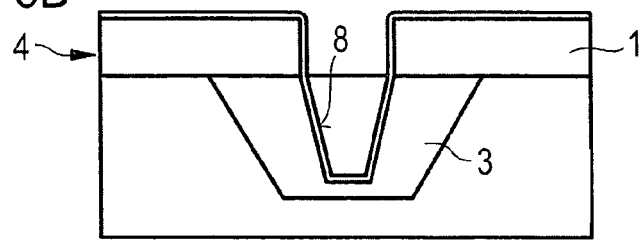
Figure 3C:
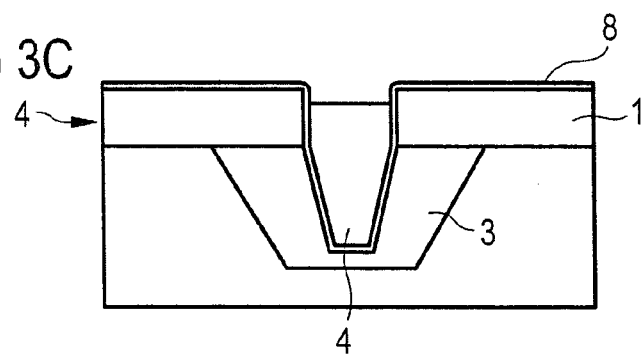
Figure 3D:
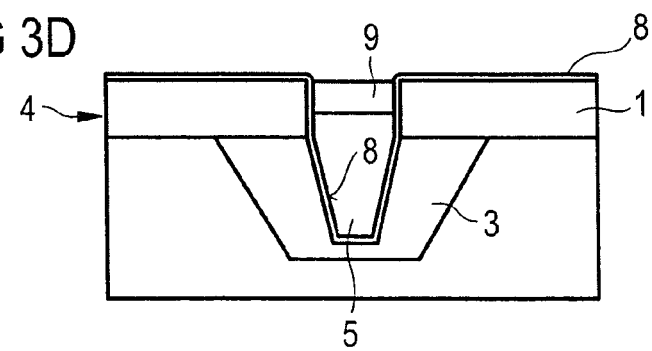
Figure 3E:
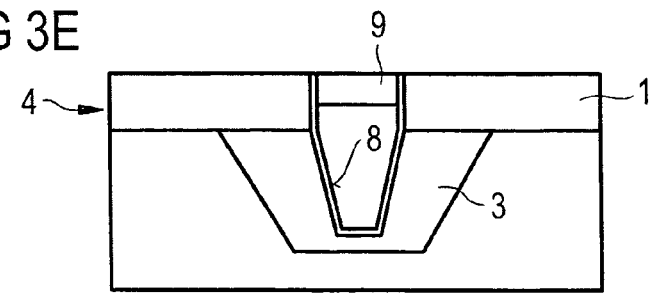

The schematic sectional illustration according to FIG. 1d shows a variant in which the buried bit line 5 is simultaneously used as a well contact.

In order to be able to realize this, the following method steps are necessary (FIGS. 1a-e):
a) Etching of the floating gate 1.
b) Etching of the buried bit line 5 (BB) through the floating gate 1 and formation of a trench 6.
c) Deposition of tungsten 7 in the etching trench 6 and subsequent chemical mechanical polishing (CMP).
d) Etching back of the tungsten 7.
e) Filling of the etching trench 6 with an oxide and subsequent etching back.

The etching trench 6 may extend into the insulation 3 or through the latter. In the latter case, a well contact may additionally be realized by means of the buried bit line 5.

In one variant, the buried bit line 5 is preferably situated above the normal level of the insulation 3 (FIG. 1b).

The second exemplary embodiment (FIGS. 2a-e) comprises the following method steps:
a) Etching of the floating gate 1.
b) Etching of the trench 6 through the floating gate 1 and coating of the trench 6 with a liner 8.
c) Deposition of tungsten 7 in the trench 6 and chemical mechanical polishing.
d) Etching back of tungsten 7.
e) Concluding filling of the trench 6 with an oxide 9 and etching back.

Instead of tungsten, tungsten silicide may also be used for filling the trench 6.

In the case of the third variant (FIGS. 3a-e), finally, tungsten is replaced by highly doped poly-Si. The following method steps are processed for this purpose:
a) Etching of the floating gate 1.
b) Etching of the trench 6 for the buried bit line 5 through the floating gate 1 and filling of the trench 6 with an oxide liner 8.
c) Deposition of poly-Si in the trench 6 and etching back.
d) Reoxidation of the poly-Si.
e) Concluding filling of the trench with an oxide 9 and concluding etching back.

In all of the variants, the floating gate 1 is used as an etching mask.

Figure 4:
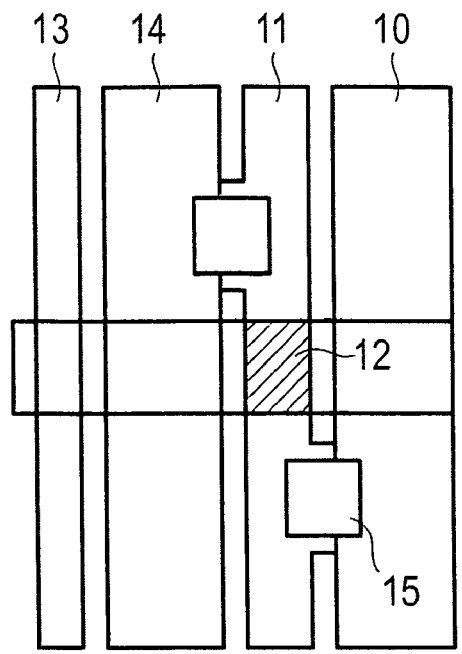
FIG. 4 shows the layout of a conventional UCP flash memory cell (prior art)
Figure 5:
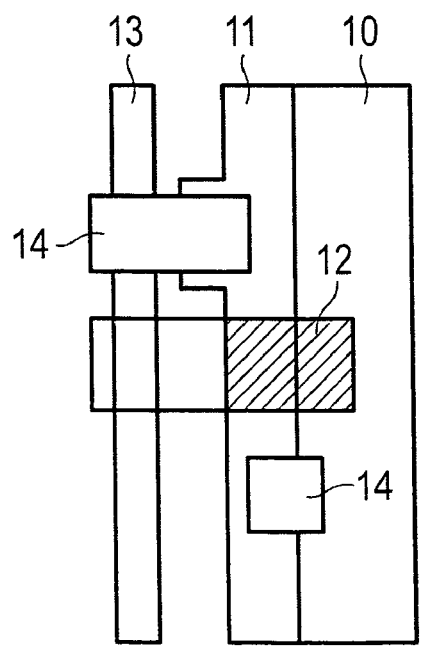
FIG. 5 shows the layout of a UCP flash memory cell with a significantly reduced area requirement that is made possible by means of the simplified method for producing a bit line buried in self-aligning fashion.

The comparison between FIG. 4 (prior art) and FIG. 5 with a buried bit line shows the considerable saving of area.

The conventional UCP flash memory cell comprises a drain 10, a source region 11, a cell region 12 and bit lines 13, 14. Different metallization planes are contact-connected through vias 15. The significant saving of area can clearly be discerned in the case of the UCP flash memory cell that can be seen from FIG. 5.

What is claimed is:

1. A method of making a semiconductor device, the method comprising:
   providing a semiconductor body;
   forming an insulation region in said semiconductor body;
   forming a floating gate layer over both said semiconductor body, and said insulation region formed in the semiconductor body;
   patterning the floating gate layer to expose a portion of the previously formed insulation region;
   forming a recess in a portion of the insulation region exposed by the patterned floating gate layer;
   depositing a conductor within the recess, the conductor serving as a buried bit line; and
   forming an insulator within the recess over the conductor.

2. The method as claimed in claim 1, wherein the floating gate layer comprises a polysilicon layer.

3. The method as claimed in claim 1, wherein the recess is formed by etching the insulation layer in a manner self-aligned to the patterned floating gate layer.

4. The method as claimed in claim 1, wherein forming an insulator comprises filling the trench with an oxide.

5. The method as claimed in claim 1, wherein depositing a conductor within the recess comprises depositing the conductor and etching back the conductor.

6. The method as claimed in claim 1, wherein the conductor comprises a metal having a high melting point.

7. The method as claimed in claim 1, wherein the conductor comprises tungsten.

8. The method as claimed in claim 1, wherein the conductor comprises a silicide.

9. The method as claimed in claim 1, wherein the conductor comprises highly doped polysilicon.

10. The method as claimed in claim 1, wherein depositing a conductor comprises filling the recess with tungsten or tungsten silicide by means of a CVD deposition.

11. The method as claimed in claim 1, wherein forming a recess comprises forming a recess that has a bottom surface within the insulation region.

12. The method as claimed in claim 1, wherein forming a recess comprises forming a recess that extends through the insulation region and into the semiconductor body.

13. The method as claimed in claim 12, wherein the semiconductor body includes a doped region beneath the insulation region, wherein forming a recess comprises etching down to the doped region, and wherein the conductor is electrically coupled to the doped region.

14. The method as claimed in claim 1, further comprising depositing one or more liners in the recess prior to depositing the conductor.

15. The method as claimed in claim 14, wherein the liner comprises at least one of silicon dioxide, silicon nitride, titanium and/or titanium nitride.

16. A method for producing bit lines for UCP flash memories having a floating gate arranged on a silicon substrate and an insulation in the silicon substrate under the floating gate, the method comprising:
   providing a silicon substrate;
   forming an insulation region made of a temperature-resistant material in said silicon substrate;
   depositing a polysilicon layer over both said silicon substrate, and said insulation region;
   patterning and etching the polysilicon layer to form the floating gate so that a portion of the insulation region is exposed, the patterning and etching being performed using a photolithography step subsequent to forming said insulation region;
   forming a buried bit line within the exposed portion of the insulation region under the floating gate, the buried bit line being formed in a self-aligned manner with respect to the floating gate by using the patterned floating gate as an etching mask, said bit lines formed by etching a trench into the insulation and subsequently filling said trench with a low-impedance material;
   etching back the low-impedance material filling said trench; and
   filling the trench with an oxide after the low-impedance material has been etched back.

17. A semiconductor device comprising:
   a semiconductor body defining a trench;
   an insulation region, said insulation region comprising an insulating material deposited in said trench formed in the semiconductor body;
   a floating gate layer deposited over the semiconductor body, and the insulation region, the floating gate layer patterned to expose a portion of the insulation region;
   a bit line conductor disposed in the exposed trench in a portion of the insulation region that is not covered by the floating gate; and
   an insulator within the trench over the bit line conductor.

18. The device as claimed in claim 17, wherein the floating gate comprises polysilicon and wherein the insulator comprises an oxide.

19. The device as claimed in claim 17, wherein the bit line conductor extends through the insulation region and into a portion of the semiconductor body beneath the insulation region.

20. The method as claimed in claim 1, wherein the conductor comprises tungsten, a silicide, or highly doped polysilicon.

* * * * *